United States Patent
Boybat Kara et al.

(10) Patent No.: US 9,767,408 B1
(45) Date of Patent: Sep. 19, 2017

(54) MULTI-MEMRISTIVE SYNAPSE WITH CLOCK-ARBITRATED WEIGHT UPDATE

(71) Applicant: International Business Machines Corporation, Armonk, NY (US)

(72) Inventors: Irem Boybat Kara, Zurich (CH); Manuel Le Gallo, Zurich (CH); Abu Sebastian, Adliswil (CH); Tomas Tuma, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/268,007

(22) Filed: Sep. 16, 2016

(51) Int. Cl.
  *G06F 15/18* (2006.01)
  *G06N 3/08* (2006.01)
  *G06N 3/063* (2006.01)
  *G06N 3/04* (2006.01)

(52) U.S. Cl.
  CPC ............ *G06N 3/0635* (2013.01); *G06N 3/04* (2013.01); *G06N 3/084* (2013.01)

(58) Field of Classification Search
  None
  See application file for complete search history.

(56) References Cited

U.S. PATENT DOCUMENTS

| | | | |
|---|---|---|---|
| 7,904,398 B1 * | 3/2011 | Repici | G06N 3/063 706/15 |
| 8,433,665 B2 | 4/2013 | Tang et al. | |
| 2009/0292661 A1 | 11/2009 | Haas | |
| 2013/0073499 A1 * | 3/2013 | Izhikevich | G06N 3/049 706/27 |
| 2015/0019468 A1 | 1/2015 | Nugent et al. | |
| 2015/0170028 A1 | 6/2015 | Gupta et al. | |
| 2016/0055409 A1 | 2/2016 | Majumdar et al. | |

OTHER PUBLICATIONS

Jo et al. "Nanoscale Memristor Device as Synapse in Neuromorphic Systems", Nano Lett. 2010, pp. 1297-1301.*
Sichonidis et al. "A Memristive Circular Buffer for Real-Time Signal Processing", MOCAST, Jun. 2016, pp. 4.*

* cited by examiner

*Primary Examiner* — Li-Wu Chang
(74) *Attorney, Agent, or Firm* — Scully, Scott, Murphy & Presser, P.C.; Daniel P. Morris, Esq.

(57) ABSTRACT

A method and system providing a multi-memristive synaptic element for a cognitive computing system. The multi-memristive synaptic element comprises an array of memristive devices. The method comprises arbitrating a synaptic weight allocation, a related synaptic weight being represented by a synaptic weight variable of said multi-memristive synaptic element, updating said synaptic weight variable by a delta amount, and assigning said memristive devices to elements of a clock-like ordered circular list for selecting a particular memristor of said memristive devices requiring to be updated by a deterministic, periodic global clock that points to a different memristor at every clock tick, such that said multi-memristive synaptic element has a larger dynamic range and a more linear conductance response than a single memristor synaptic element.

18 Claims, 14 Drawing Sheets

100

102  providing an arbitration module 104  updating the synaptic weight variable 106  assigning the memristive devices to elements of a clock-like ordered circular list

MULTI-MEMRISTIVE SYNAPSE WITH CLOCK-ARBITRATED WEIGHT UPDATE

FIELD

The present disclosure relates generally to a method for providing a multi-memristive synaptic element, and more specifically, to a multi-memristive synaptic element for use in a cognitive computing system. The present disclosure relates further to a related multi-memristive synaptic element for a cognitive computing system and a computer program product.

BACKGROUND

It is widely believed that mankind is entering the third era of cognitive computers. Cognitive computers may extend the boundaries of human cognition by deriving insights and intelligence from the vast amount of data at our disposal. Today's cognitive computers are still based on the von Neumann computing architecture that is highly area/power inefficient due to the physical separation between memory and logic. To address this challenge, an alternative brain inspired neuromorphic computing architecture is heavily researched—either to complement the existing cognitive computers or to replace them in the long run. However, to fully realize the areal/power benefits of such architecture, it is essential to realize the synaptic and possibly the neuronal elements using nanoscale memristive devices. Memristive devices are resistive devices whose resistance depends on the history of the current that had previously flown through it. They can be arranged in high-density crossbar arrays and each memristor can be used to store multiple bits of information. These properties make memristors a suitable to be used as synapses in neuronal networks, in which is a vast amount of synapses with analog values. However, memristors have limitations such as nonlinearity, limited dynamic range, a symmetric conductance response and devise variability that pose a key challenge. To achieve satisfactory network performance, it is essential to have a linear symmetric device with enough dynamic range.

There are several disclosures relating to a method providing a multi-memristive synaptic element for a cognitive computing system. For example, US 20150170028 A1 discloses a method of providing memristive devices in a neural network and updating weights of each synapse between an input layer neuron and an output layer neuron, wherein the weight is spike timing modulated with updates. This method may be used for pattern recognition. Additionally, the method includes classifying a spike pattern represented by a set of inter-spike intervals, regardless of noise in the spike pattern.

Further, US 20090292661 A1 discloses a method of utilizing memristor arrays in neural networks and implementing synaptic weight updates. The document pertains to compact synaptic circuits and networks comprising compact synaptic circuits that exhibit functional characteristics of biological synapses and networks of synapses including, but not limited to, spike timing dependent plasticity.

However, it is a known disadvantage of traditional approaches to address and synchronize sub-elements of the memristor devices even if arrays of memristors are used.

Hence, there may be a need to overcome the limitations of traditional approaches, namely the nonlinearity of memristors and a coordination of individual elements of a memristor array used as synaptic elements.

SUMMARY

According to one aspect, there is provided a method for providing a multi-memristive synaptic element for a cognitive computing system. The multi-memristive synaptic element may comprise an array of memristive devices. The method comprises: providing an arbitration module for arbitrating a synaptic weight allocation, a related synaptic weight being represented by a synaptic weight variable of the multi-memristive synaptic element, updating the synaptic weight variable by a delta amount, and assigning, by the arbitration module, the memristive devices to elements of a clock-like ordered circular list for selecting a particular memristor from the memristive devices required to be updated by a deterministic, periodic global clock that may point to a different memristor at every clock tick, such that the multi-memristive synaptic element has a larger dynamic range and a more linear conductance response than a single memristor synaptic element.

According to another aspect, there is provided a multi-memristive synaptic element for a cognitive computing system. The multi-memristive synaptic element comprises an array of memristive devices, as well as an arbitration module for arbitrating a synaptic weight allocation, a related synaptic weight being represented by a synaptic weight variable of the multi-memristive synaptic element, and an updating unit adapted for updating the synaptic weight variable by a delta amount. The arbitration module may also be adapted for assigning the memristive devices to elements of a clock-like ordered circular list for selecting a particular memristor of the memristive devices requiring to be updated by a deterministic, periodic global clock that may point to a different memristor at every clock tick, such that the multi-memristive synaptic element may have a larger dynamic range and a more linear conductance response than a single memristor synaptic element.

The proposed method providing a multi-memristive synaptic element for a cognitive computing system, as well as the related multi-memristive synaptic element, may offer multiple advantages and technical effects:

The realization of synaptic elements using memristive devices—in particular using array of memristive devices—represents a key step towards a realization of ultra-dense neuromorphic hardware devices, which require only little power. The proposed solution mitigates the up to now undesirable attributes of memristors devices such as device nonlinearity, limited dynamic range, asymmetric response, the variability validity, reliability, etc. The usage of an arbitration module combined with a global clock allows for a coordinated update of weights of individual synaptic elements, as well as a large amount of synaptic elements of a neural network. The dynamic range of the synaptic element is increased without any additional circuitry or reliance on stochasticity of the memristors.

Additionally, the proposed concept originally conceived to realize a synaptic element may easily be generalized to any memory for storage at large.

The proposed concept may be implemented using different kinds of memristor technologies, as well as different kinds of neural networks, like artificial neural networks or spiking neural networks. The proposed method is completely deterministic and does not require any pseudorandom number generators.

It is also possible to require less numbers of weight states per device to obtain a total weight with a larger number of states. This increases the design flexibility and may also reduce costs for the production of the synaptic elements.

Furthermore, gradual resets may be obtained by applying a reset to individual memristors.

In the following, additional embodiments of the method for providing a multi-memristive synaptic element for a cognitive computing system and the related system will be described. It may be noted that aspects of the embodiments are applicable for both, the system and the method.

According to one preferred embodiment of the method, the memristive devices may be organized in a parallel array. This way, fine grained increments and/or decrements may be applicable to the synaptic element in a better way than known from traditional technologies. The parallelism of the memristive device makes it easy to calculate the total resistance of the parallel array of memristors using Ohm's law.

According to a further preferred embodiment of the method, the cognitive computing system may be an artificial neural network trained with back-propagation. Back-propagation may be understood as an abbreviation for 'backward-propagation of errors'. It is a common method of training for artificial neural networks used in conjunction with an optimization method such as gradient descent. The method calculates the gradient of a loss function with respect to all the weights in the network. The gradient is fed to the optimization method which in turn uses it to update the weights in an attempt to minimize the loss function.

Back-propagation may require a known, desired output for each input value in order to calculate the loss function gradient. It is therefore usually considered to be a supervised learning method. Back-propagation may typically require that an activation function used by the artificial neurons (or 'nodes') be differentiable. Hence, the inventive concept makes it easy to implement effective related methods—like back-propagation—for proper results.

According to an optional embodiment of the method, an output $x_j$ of a post-synaptic neuron may be given by $x_j=f(\Sigma(x_i, W_{ij}))$, wherein f is a non-linear function, $x_i$ is an output of a pre-synaptic neuron, and $W_{ij}$ is the synaptic weight variable. Applying weight to the inputs of a post-synaptic neuron allows for a flexible adaptation of the network behavior.

According to one advantageous embodiment of the method, the amount may be positive or negative. Hence, the adaptation of the network behavior may represent a positive feedback learning loop or a negative feedback learning loop, just like a natural network of natural neurons.

According to one additionally advantageous embodiment of the method, the delta amount $\Delta W_{ij}$ of the synaptic weight variable may be given by $\Delta W_{ij}=\lambda*x_i*\delta_j$. Thereby, $\lambda$ may be a learning rate, $x_i$ may be an output of a pre-synaptic neuron, and $\delta_j$ maybe is a back-propagated delta error. Using this algorithm, the behavior of the synaptic element may be described pretty well.

According to one possible embodiment of the method, the cognitive computing system may be a spiking neural network. Spiking neural networks (SNNs) represent a third generation of neural network models, increasing the level of realism in a neural simulation. Thus, the proposed method and system may work seamlessly with different kinds of neural networks.

According to one permissive embodiment of the method, the memristor may be selected from the group consisting of a phase change memristor, an electro-ionic memristor and a spintronic memristor. Hence, all known types of memristors may be used to implement the method. No limitations regarding the type of memristors may be given.

According to a further permissive embodiment of the method, the memristor may be a binary memristor or a multilevel memristor. I.e., also these alternatives may be used in the context of the proposed method. The multi-level synaptic element may allow an even more linear conductive response and a larger dynamic range than the usage of a binary memristor.

According to one advanced embodiment, the method may also comprise providing a second clock in form of a circular list for a further update frequency of the memristive devices. For example, such a second global clock—i.e., a reset clock—may be used as an instrument to act against the fact that the same reset pulse may lead to different conductance or resistance values for different phase change memristor (PCM) devices because they may be in different activation levels and there is also inherent device variability. A probabilistic reset operation is hard to achieve in PCMs. Thus, the proposed approach is instrumental for achieving a more gradual decrease in conductance. For this, a full reset may be performed infrequently. This second clock is independent from the global clock controlling the weight updates of the memristors of the memristive synaptic element. The second clock may also be implemented in a circular list and may, e.g., have the same number of list elements as the global clock. In one embodiment, each full cycle of the reset clock a full reset may be triggered. It may also be advantageous if the update frequencies of the first and the second clock are coprime to each other. This may prevent a situation under which the same memristive device may be addressed repeatedly.

According to another advanced embodiment of the method, a number of the ordered list of elements in the ordered circular list and an increment rate for the ordered circular list may relate to each other in such a way that during consecutive iterations of selections at least one sub-element is different. This feature may ensure not always the same memristors are selected for weight updates. The relationship between the number of elements—elements of the ordered list vs. increment rate—may ensure that all memristors may be addressed equally often in the long run.

According to one further advantageous embodiment of the method, a total number of memristors of the memristive synaptic element may be equal for each memristive synaptic element in the cognitive computing system. Thus, a perfect match between the number clock positions and memristors may be achieved. The global clock may never point to a non-existent memristor. Each clock cycle may be used to update the synaptic variable weight.

According to one additionally preferred embodiment of the method, a total number of list elements in the ordered circular list—and thus, the number of memristors in the multi-level synaptic element—may be co-prime to an increment rate for the ordered circular list, i.e. they do not have a common divisor. This algorithm may ensure that in several revolutions of the global clock all elements of the circular list may be addressed. None of the circular list targets will ever be "forgotten" or not addressed.

Furthermore, embodiments may take the form of a related computer program product, accessible from a computer-usable or computer-readable medium providing program code for use, by or in connection with a computer or any instruction execution system. For the purpose of this description, a computer-usable or computer-readable medium may be any apparatus that may contain means for storing, communicating, propagating or transporting the program for use, by or in a connection with the instruction execution system, apparatus, or device.

BRIEF DESCRIPTION OF THE SEVERAL VIEWS OF THE DRAWINGS

It should be noted that embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within the present disclosure.

The aspects defined above and further embodiments are apparent from the examples of embodiments to be described hereinafter and are explained with reference to the examples of embodiments, but to which the invention is not limited.

Figure 1:

Preferred embodiments of the invention will be described, by way of example only, and with reference to the following drawings:

FIG. 1 shows a block diagram of an embodiment of a method providing a multi-memristive synaptic element for a cognitive computing system.

Figure 2:
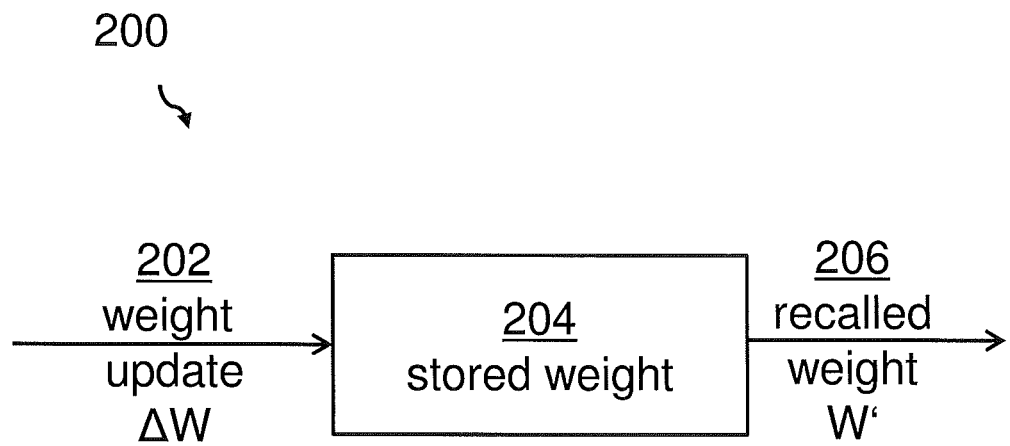

FIG. 2 shows a block diagram of an abstract model of a synaptic element.

Figure 3:
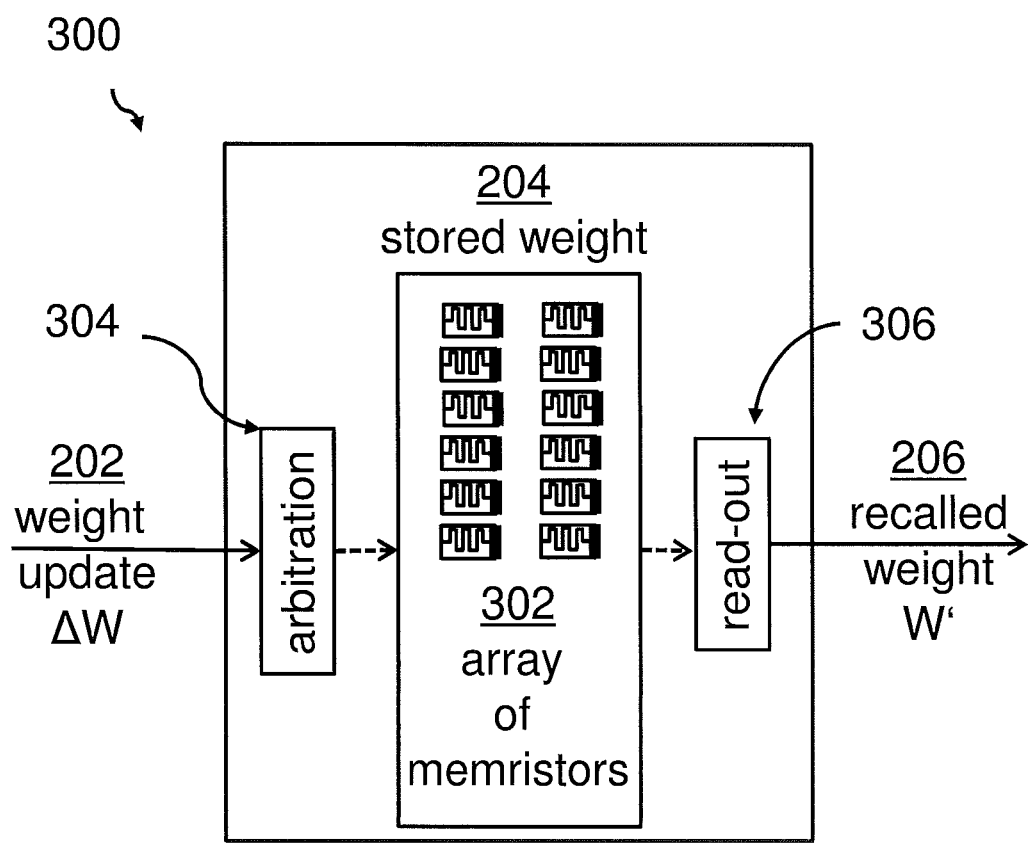

FIG. 3 shows a block diagram of a more detailed embodiment of the synaptic element.

Figure 4:
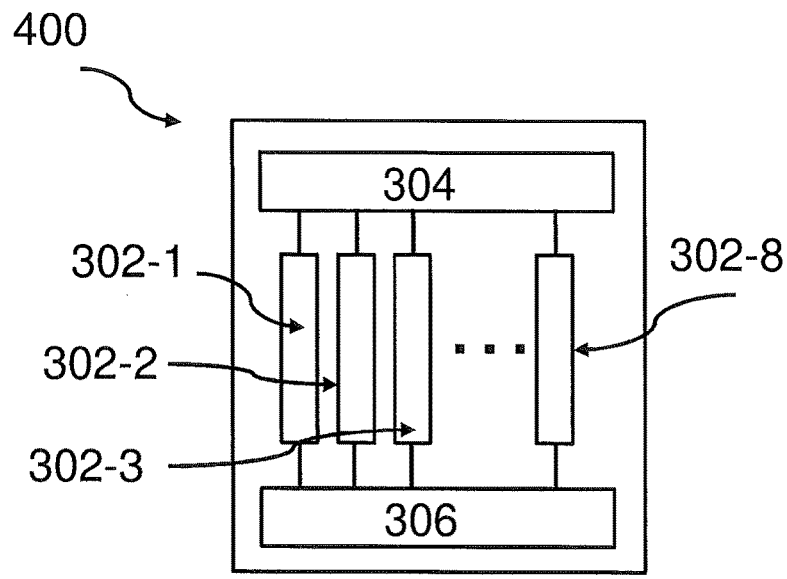

FIG. 4 shows another block diagram of a more detailed embodiment of a synaptic element.

Figure 5:
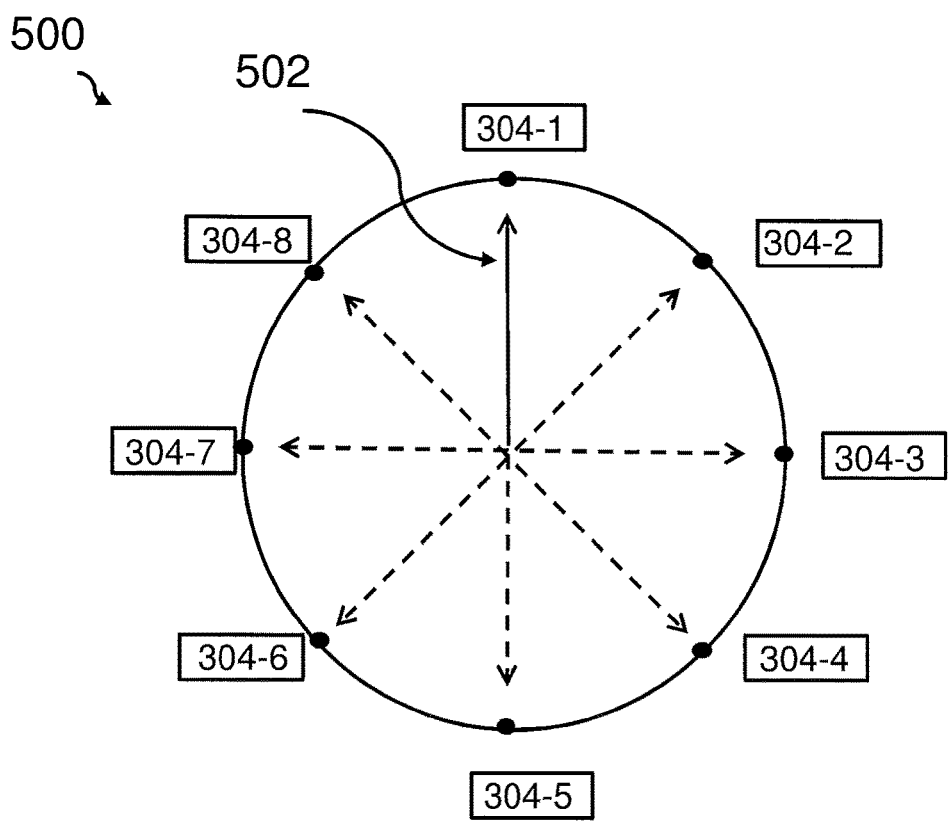

FIG. 5 shows a block diagram of an embodiment of a circular list relating to memristors.

Figure 6:
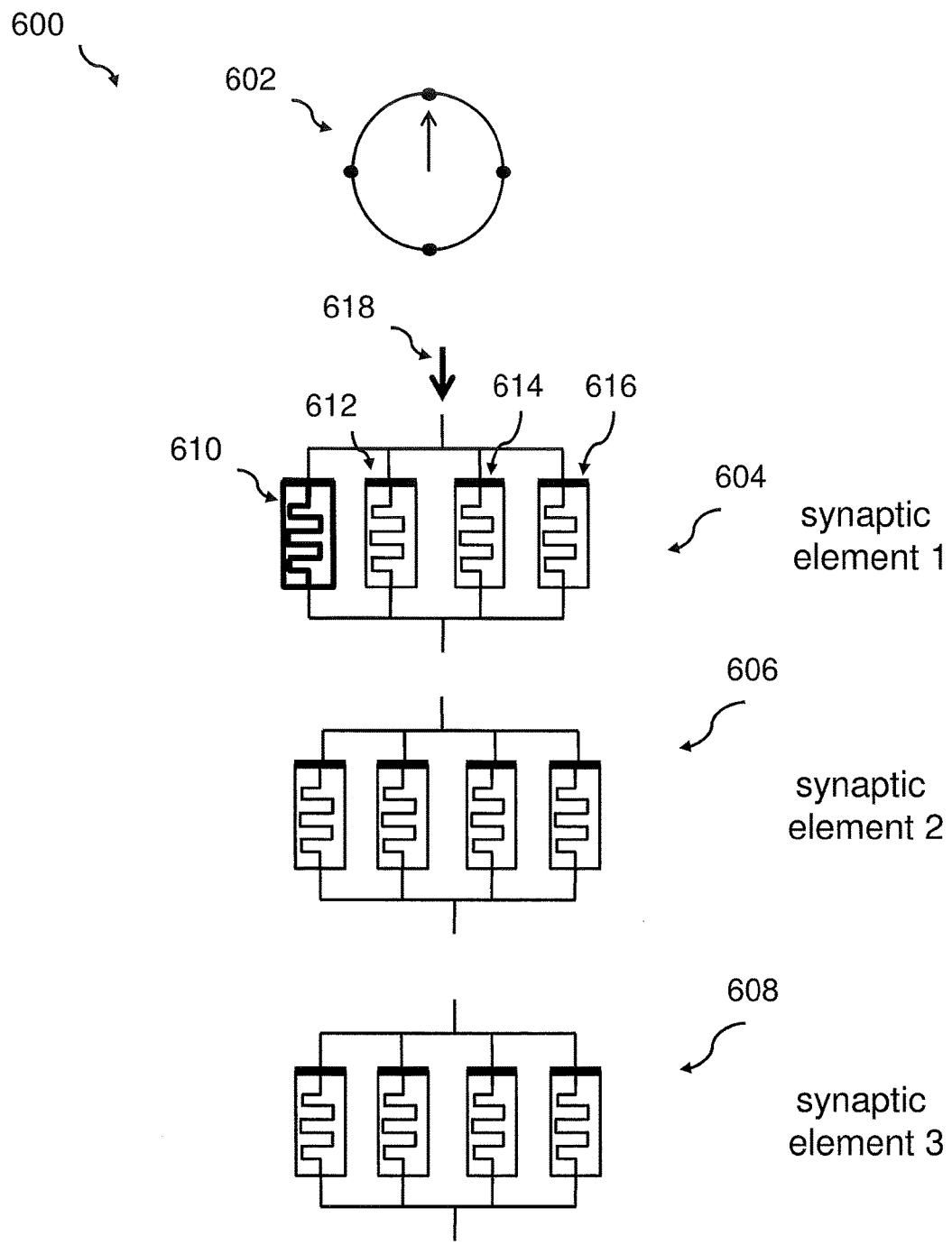

FIG. 6 shows a block diagram of an embodiment of a circular list in a first status.

Figure 7:
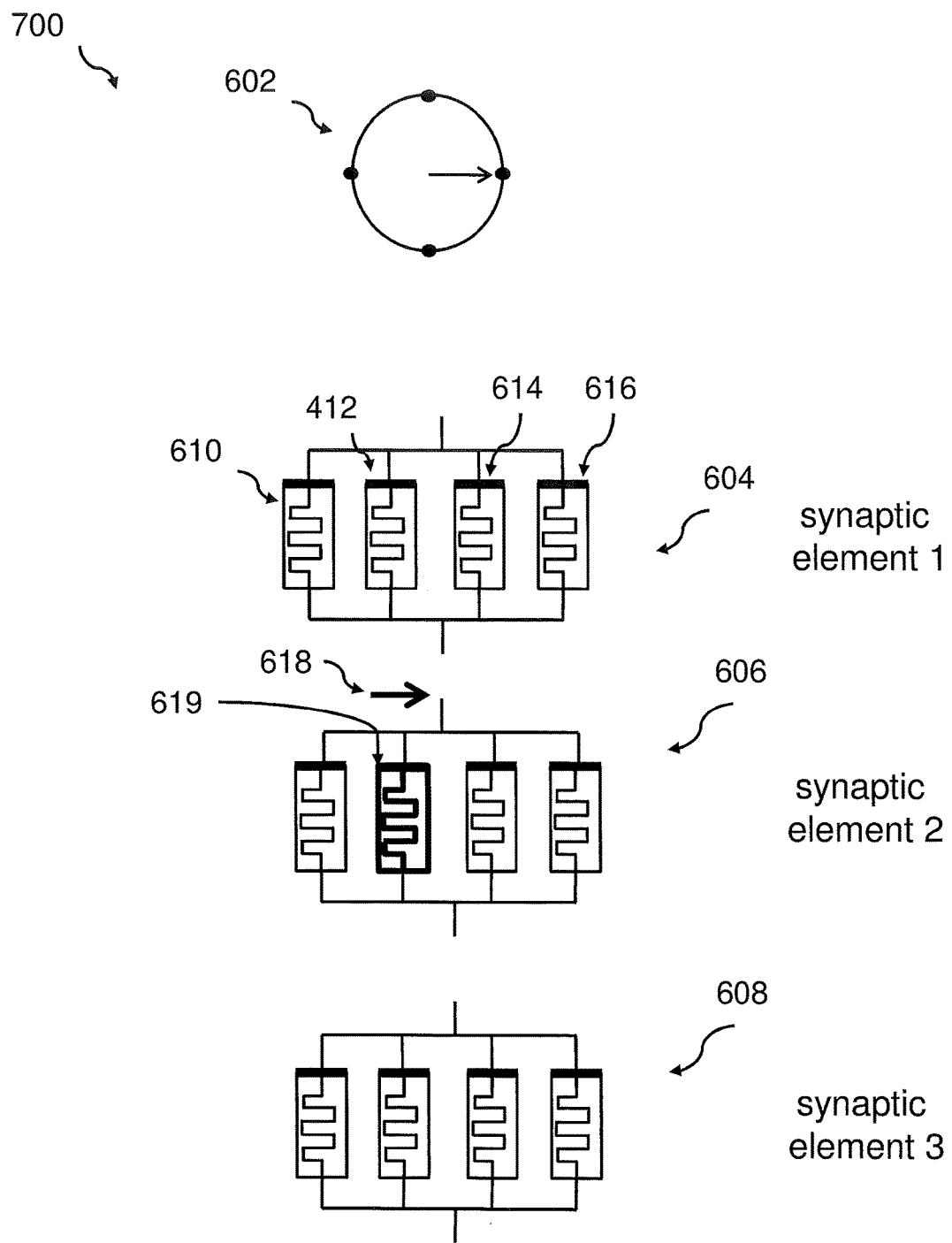

FIG. 7 shows a block diagram of an embodiment of a circular list relating in a second status.

Figure 8:
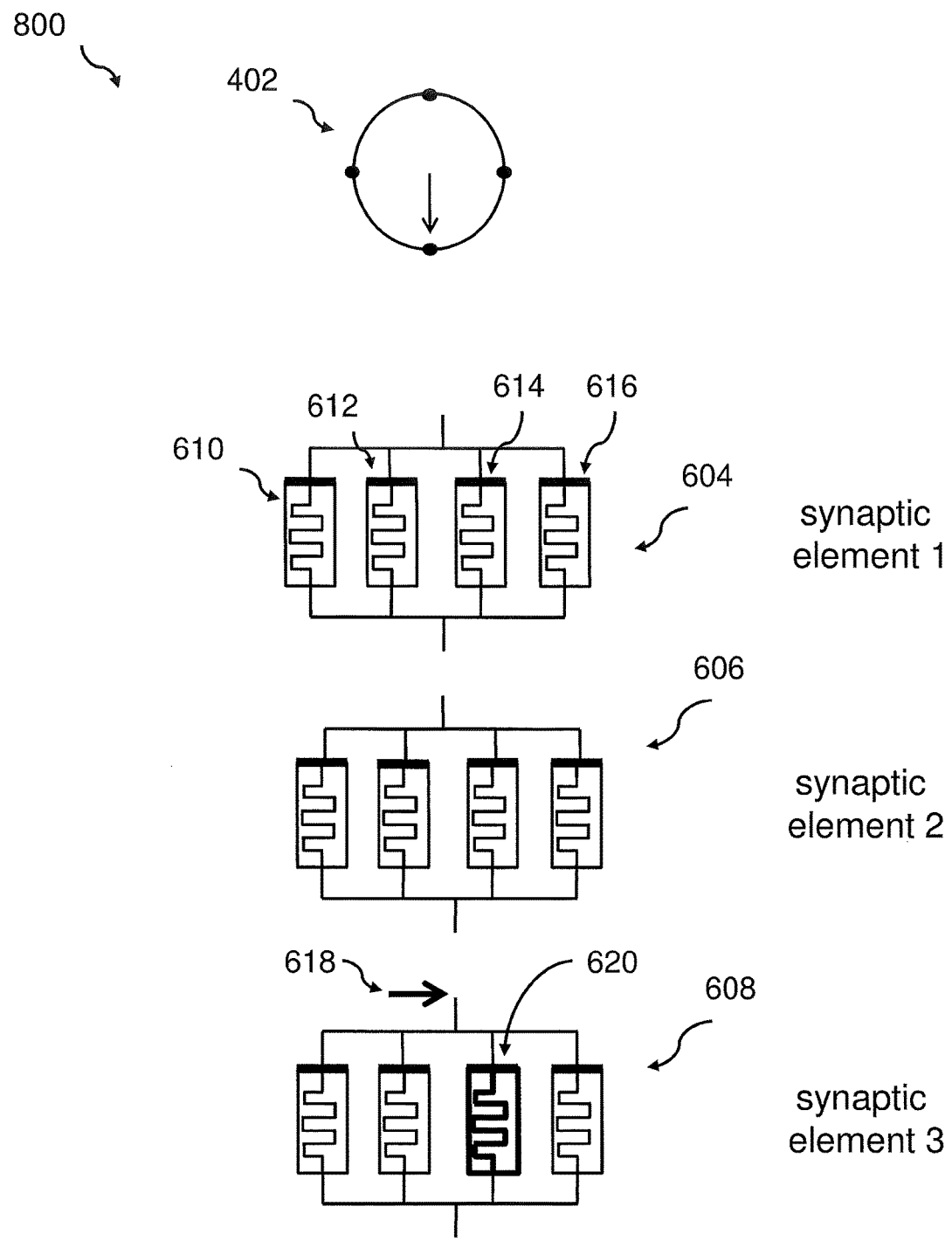

FIG. 8 shows a block diagram of an embodiment of a circular list relating in a third status.

Figure 9:
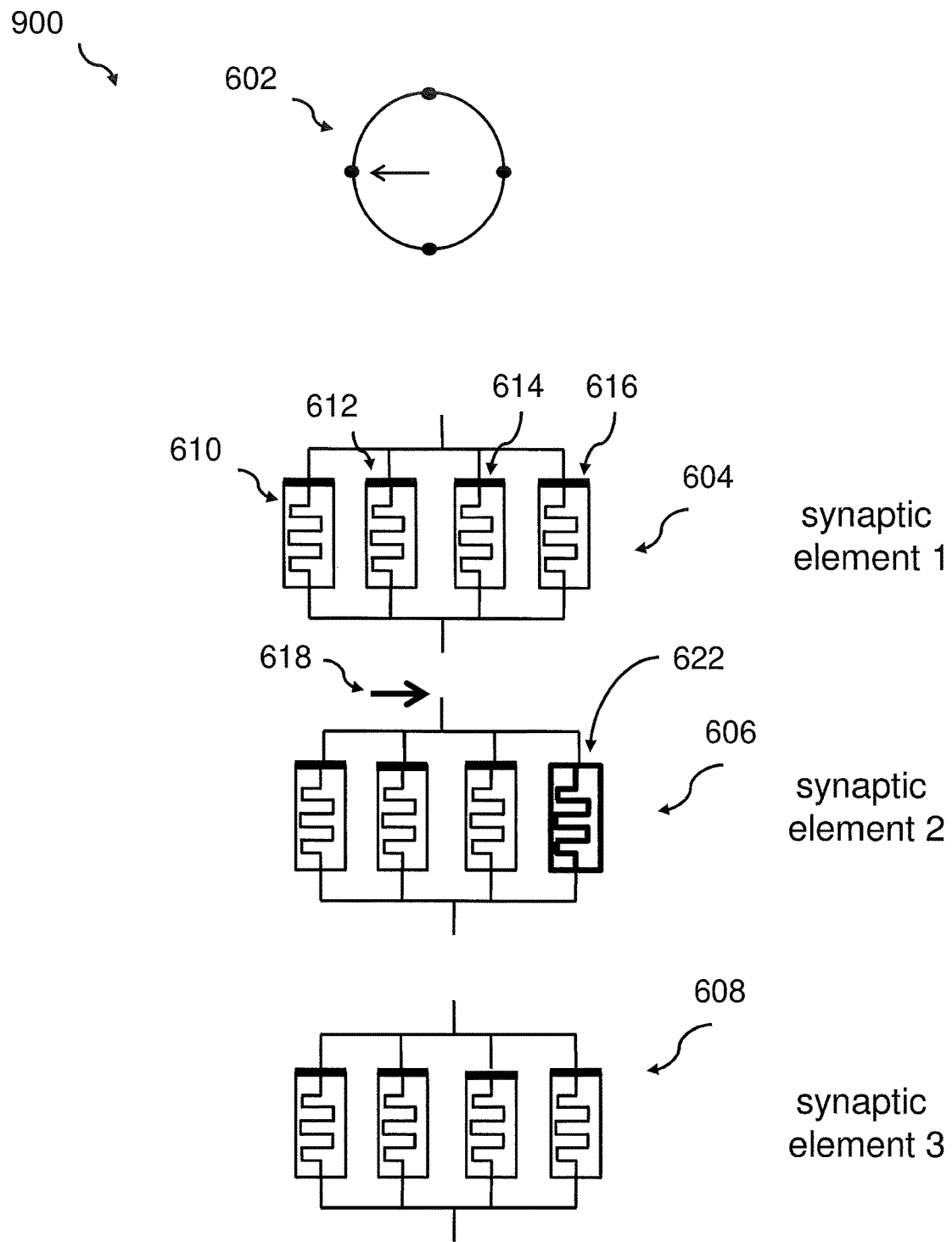

FIG. 9 shows a block diagram of an embodiment of a circular list relating in a forth status.

Figure 10:
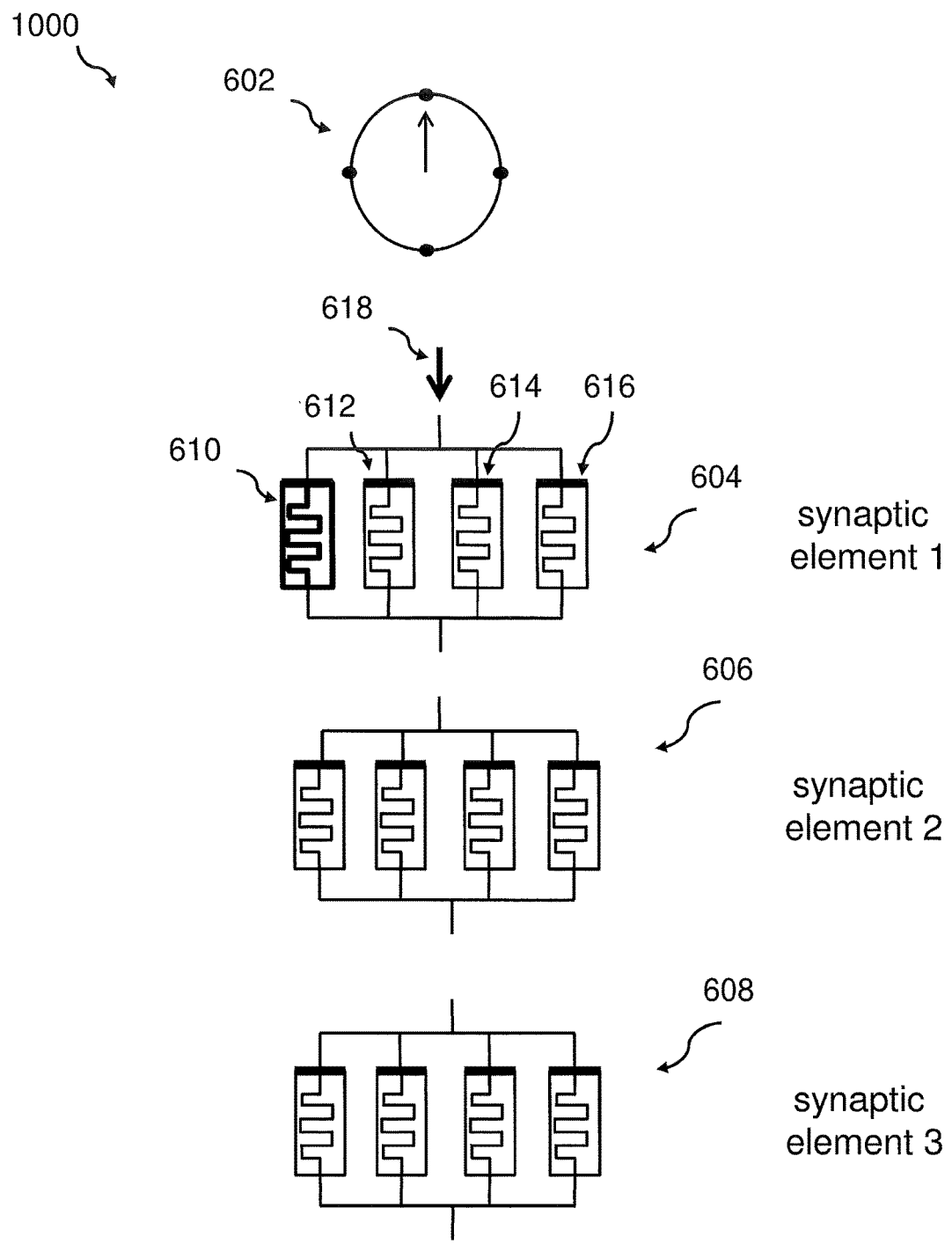

FIG. 10 shows a block diagram of an embodiment of a circular list relating in a fifth status.

Figure 11:
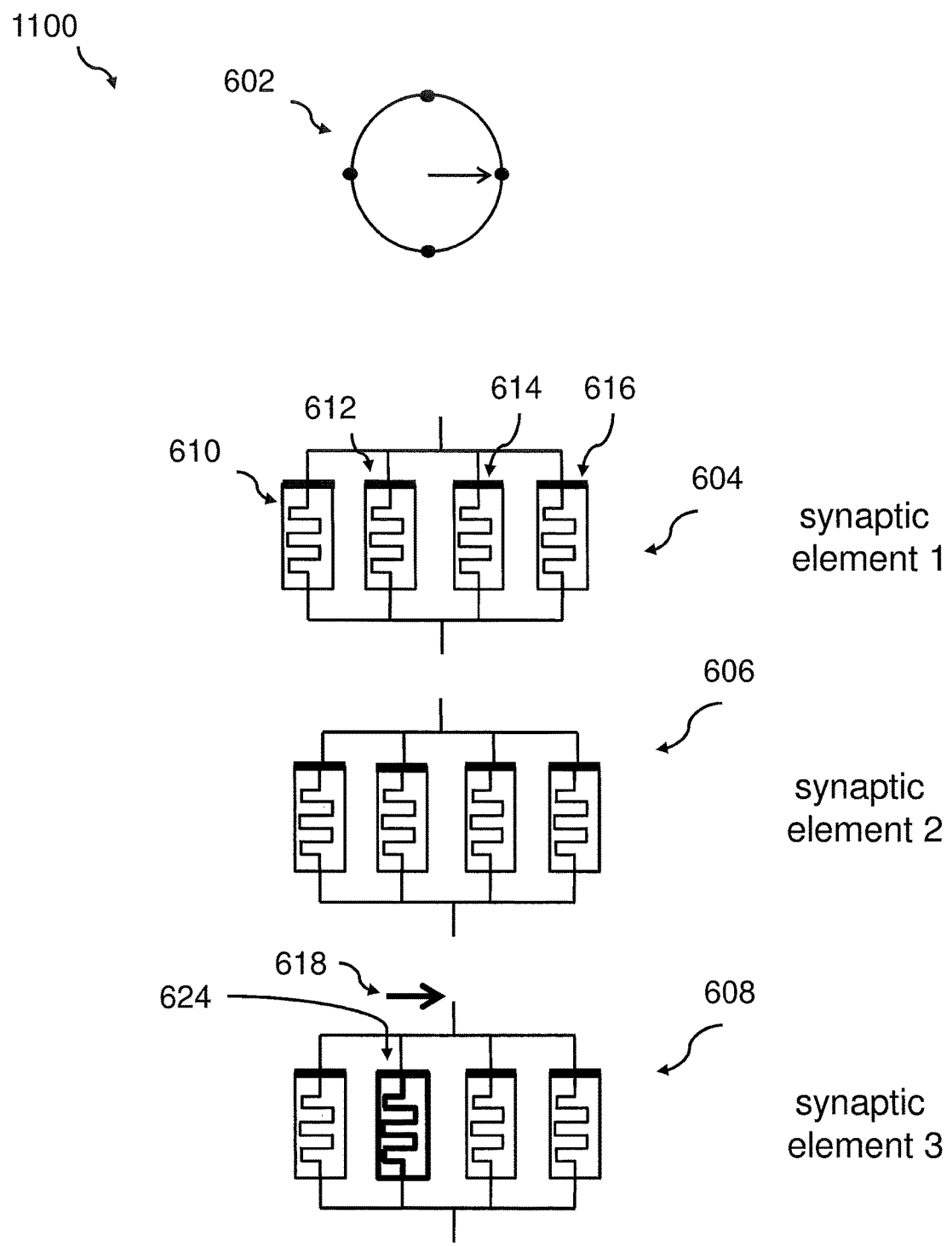

FIG. 11 shows a block diagram of an embodiment of a circular list relating in a sixth status.

Figure 12:
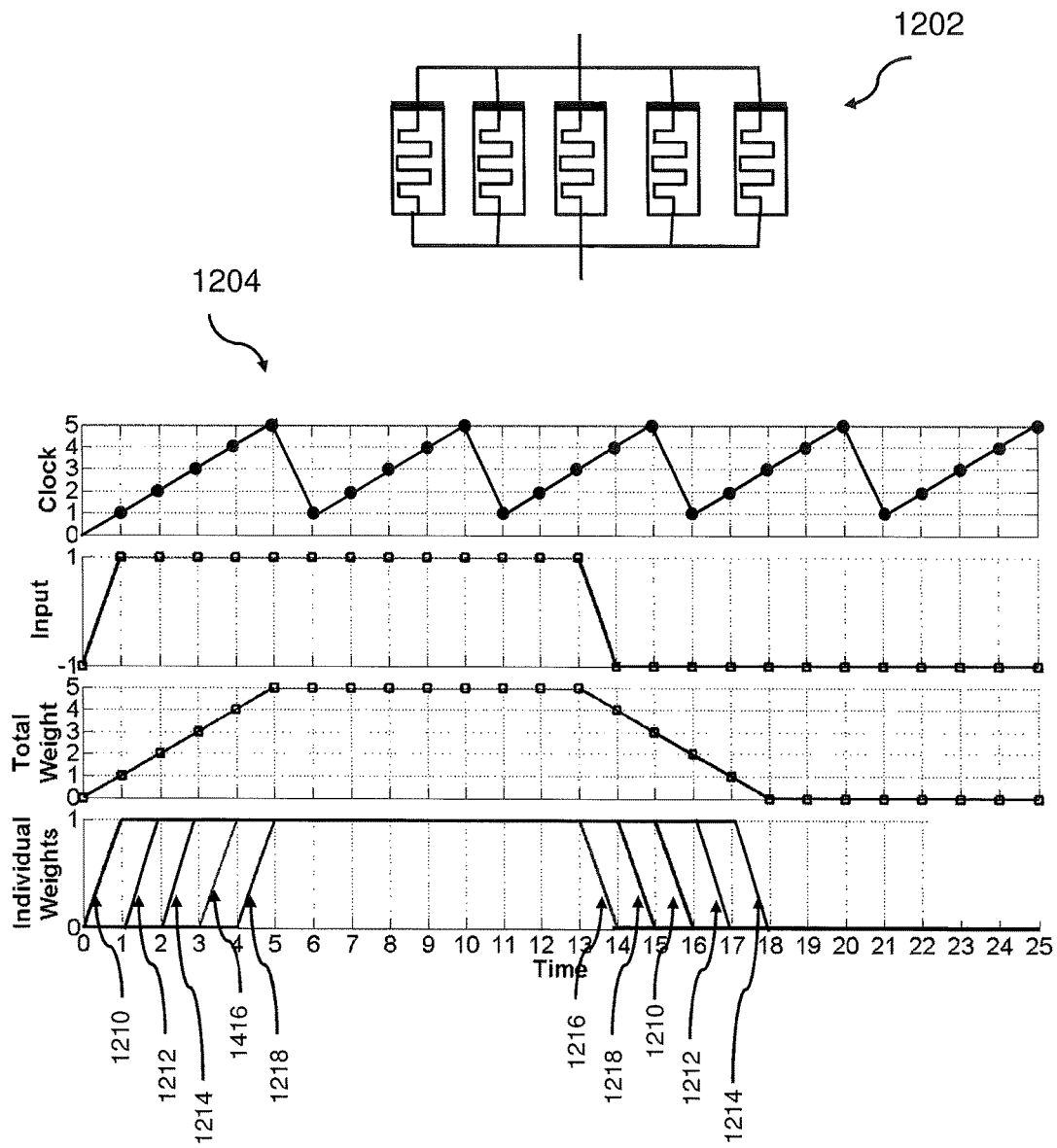

FIG. 12 shows a graph related to a synaptic element based on an array of binary memristors.

Figure 13:
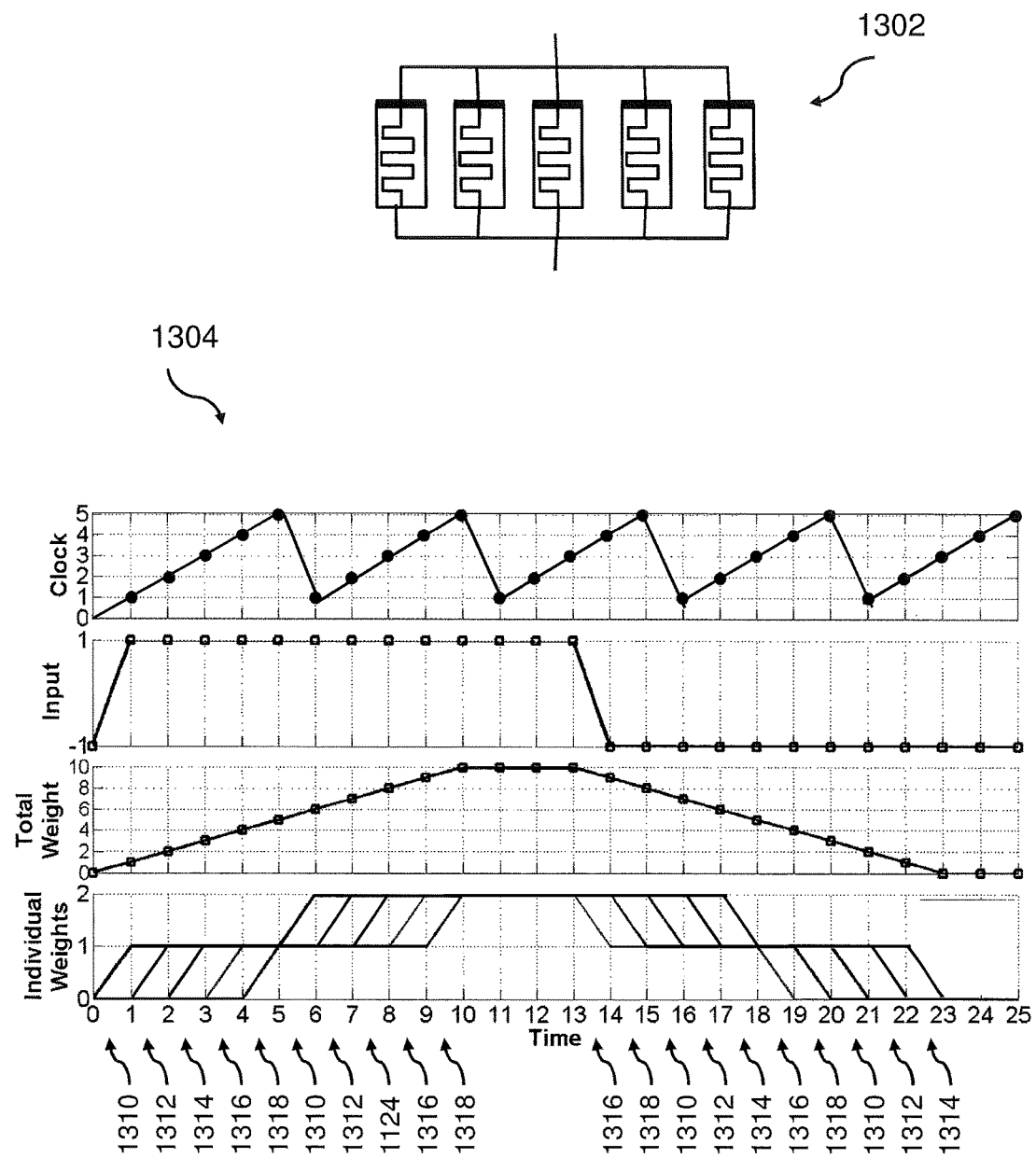

FIG. 13 shows a graph related to a synaptic element based on an array of multi-level memristors.

Figure 14:
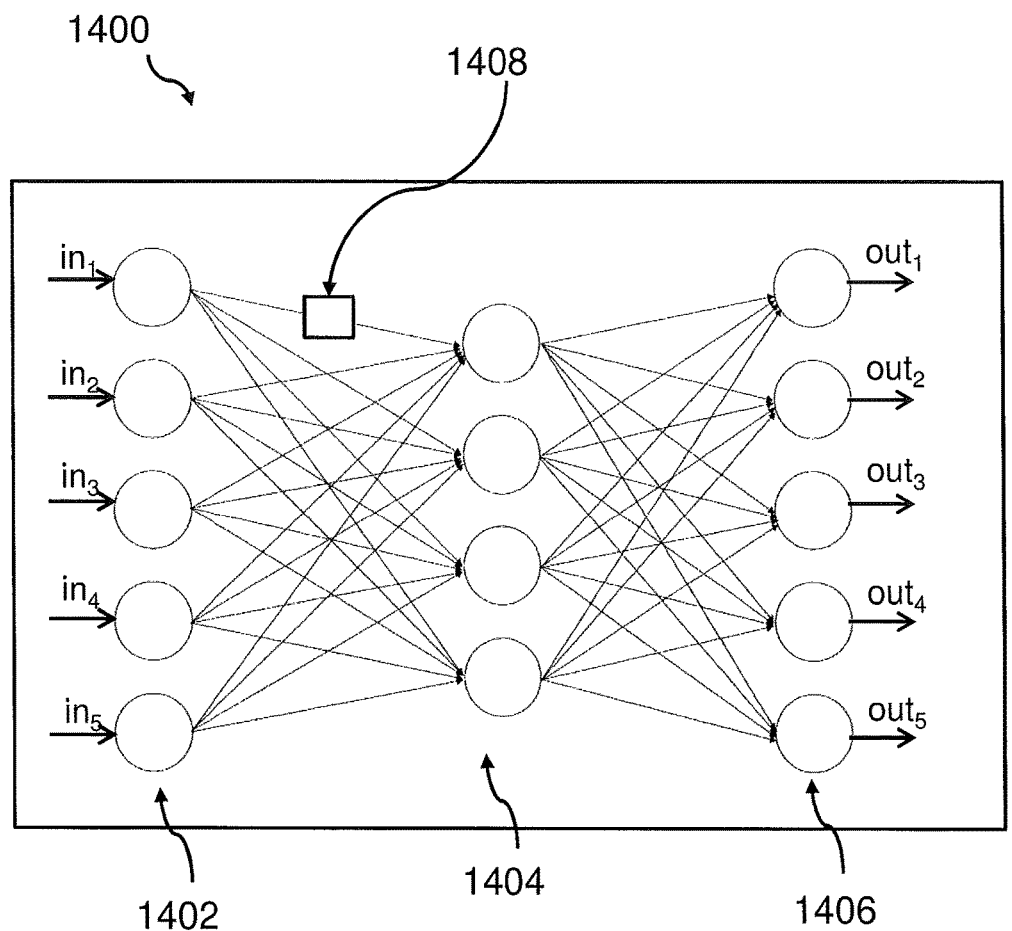

FIG. 14 shows a block diagram of an exemplary neural network.

Figure 15:
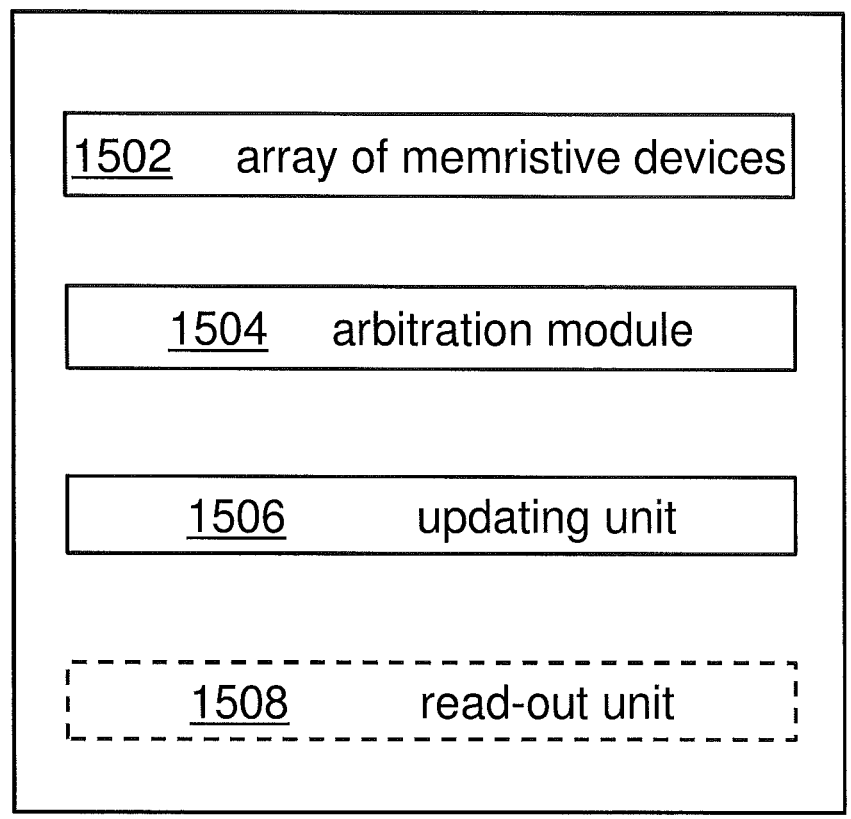

FIG. 15 shows an embodiment of the multi-memristive synaptic element for a cognitive computing system.

Figure 16:
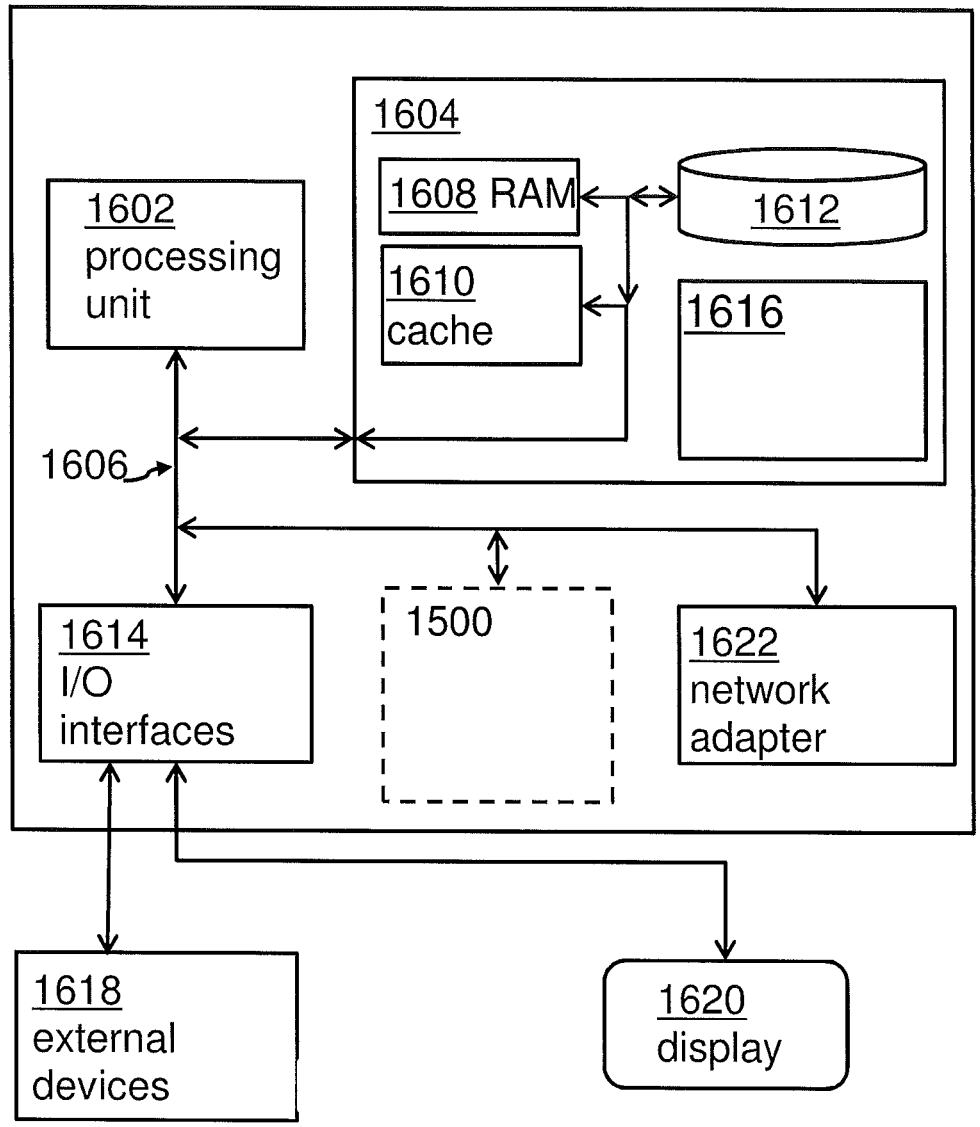

FIG. 16 shows an embodiment of a computing system in which a synaptic element may be integratable.

DETAILED DESCRIPTION

In the context of this description, the following conventions, terms and/or expressions may be used:

The term 'synaptic element' may denote a unit used in a neural network—or more general, in cognitive computing—which may be understood as a bio-inspired computing architecture that may comprise a plurality of neuronal and synaptic elements. The role of the synaptic element may be to interconnect two neurons in an elastic or plastic way and retain a "learned" experience weight.

The term 'multi-memristive synaptic element' may denote a hardware device comprising at least a plurality (at least two) memristors. In the context of this document, there may also be an arbitration module present as part of the multi-memristive synaptic element. In some instances, also a read-out unit and/or a summing unit may be present.

The term 'cognitive computing system' may denote a technology platform that—broadly speaking—is based on the scientific disciplines of artificial intelligence and signal processing. These platforms encompass machine learning, reasoning, natural language processing, speech and vision, human-computer interaction, dialog and narrative generation and more. The term cognitive computing is used to refer to new hardware and/or software that mimics the functioning of the human brain and helps to improve human decision-making. In this sense, cognitive computing denotes a new type of computing with the goal of more accurate models of how the human brain/mind senses, reasons, and responds to stimulus. Cognitive computing applications link data analysis and adaptive page displays (AUI) to adjust content for a particular type of audience. As such, cognitive computing hardware and applications strive to be more effective and more influential by design.

Some features that cognitive systems may express are:

Adaptive: They may learn as information changes and as goals and requirements evolve. They may resolve ambiguity and tolerate unpredictability. They may be engineered to feed on dynamic data in real time, or near real time.

Interactive: They may interact easily with users so that those users can define their needs comfortably. They may also interact with other processors, devices, and cloud computing services, as well as with people.

Iterative and stateful: They may aid in defining a problem by asking questions or finding additional source input if a problem statement is ambiguous or incomplete. They may "remember" previous interactions in a process and return information that is suitable for the specific application at that point in time.

Contextual: They may understand, identify, and extract contextual elements such as meaning, syntax, time, location, appropriate domain, regulations, user's profile, process, task and goal. They may draw on multiple sources of information including both, structured and unstructured/semi-structures digital information, as well as sensory inputs (visual, gestural, auditory, or sensor-provided).

The term 'arbitration module' may denote a functional unit enabled to address and/or activate individual or a subset of memristors in order to update the synaptic weight. The arbitration module may ensure that the subset of memristor may be addressed in a coordinated and deterministic way.

The term 'synaptic element' may denote a unit used in a neural network and/or cognitive computing which may be understood as a bio-inspired computing architecture that may comprise a plurality of neuronal and synaptic elements. The role of the synaptic element may be to interconnect two neurons in an elastic and/or plastic way and retain a "learned" experience weight.

The term 'synaptic weight' may denote—in neuroscience and computer science—an adaptive strength or amplitude of a connection between two nodes, corresponding in biology to the amount of influence the firing of one neuron has on another. The term is typically used in artificial and biological neural network research.—Here, it may denote, or better represent, a variable or synaptic weight variable of said multi-memristive synaptic element representing a learned behavior. The variable may be increased or decreased, wherein an increased variable value may represent a better learned behavior and a comparably lower variable value may represent a "de-learning" behavior.

The term 'memristor'—basically, a portmanteau of a memory resistor—may denote a hypothetical non-linear passive two-terminal electrical component relating electric charge and magnetic flux linkage. According to the characterizing mathematical relations, the memristor would hypothetically operate in the following way: The memristor's electrical resistance is not constant but depends on the history of current that had previously flowed through the device, i.e., its present resistance depends on how much electric charge has flowed in what direction through it in the past. The device remembers its history, the so-called non-volatility property. When the electric power supply is turned off, the memristor remembers its most recent resistance.

The term 'phase change memristor' (PCM) may denote a type of non-volatile random-access memory. Some of them exploit the unique behavior of chalcogenide glass. In PCM heat produced by the passage of an electric current through a heating element, generally made of TiN, could be used to either quickly heat and quench the glass, making it amorphous, or to hold it in its crystallization temperature range for some time, thereby switching it to a crystalline state. A PCM also has the ability to achieve a number of distinct intermediary states, thereby having the ability to hold multiple bits in a single cell.

The term 'electro-ionic memristor' may denote a memristor implemented as an electrochemically controlled hybrid ionic-conducting polymeric device.

The term 'spintronic memristor' may denote a memristor based on changing a spintronic memristor's resistance state based on a magnetization to alter the spin direction of electrons in two different sections of a device. Two sections of different electron spin directions are kept separate based on a moving "wall", controlled by magnetization, and the relation of the wall dividing the electron spins is what controls the devices' overall resistance state.

The term 'increment rate' or clock increment rate may denote an amount of change in the global clock position or global clock pointer after an operation or an independent update signal.

The term 'clock length' of the global clock may denote a number of list elements—here, each relating to memristors—organized in the global clock, i.e., the length of the circular list.

The term 'clock frequency' of the global clock may denote the speed of change in the clock position of the global clock. If, e.g., the global clock may be incremented after each write operation of a memristor, the clock frequency may depend on the write frequency. The clock frequency may also be adjusted independently.

The term 'artificial neural network' (ANNs) may denote a family of models inspired by biological neural networks (the central nervous system of animals, in particular the brain) which are used to estimate or approximate functions that can depend on a large number of inputs and are generally unknown. Artificial neural networks are typically specified using three things:

Architecture specifies what variables are involved in the network and their topological relationships—for example the variables involved in a neural network might be the weights of the connections between the neurons, along with activities of the neurons Activity Rule: Most neural network models have short time-scale dynamics: local rules define how the activities of the neurons change in response to each other. Typically, the activity rule depends on the weights (the parameters) in the network.

Learning Rule: The learning rule specifies the way in which the neural network's weights change with time. This learning is usually viewed as taking place on a longer time scale than the time scale of the dynamics under the activity rule. Usually the learning rule will depend on the activities of the neurons. It may also depend on the values of the target values supplied by a teacher and on the current value of the weights.

The term 'back-propagation' is an abbreviation for "backward propagation of errors", and is a common method of training artificial neural networks used in conjunction with an optimization method such as gradient descent. The method calculates the gradient of a loss function with respect to all the weights in the network. The gradient is fed to the optimization method which in turn uses it to update the weight, in an attempt to minimize the loss function.

Back-propagation requires a known, desired output for each input value in order to calculate the loss function gradient. It is therefore usually considered to be a supervised learning method, although it is also used in some unsupervised networks such as auto-encoders. It is a generalization of the delta rule to multi-layered feed-forward networks, made possible by using the chain rule to iteratively compute gradients for each layer. Backpropagation requires that the activation function used by the artificial neurons (or "nodes") be differentiable.

The term 'spiking neural network' (SNNs) may fall into a third generation of neural network models, increasing the level of realism in a neural simulation. In addition to neuronal and synaptic state, may SNNs also incorporate the concept of time into their operating model. The concept is that neurons in the SNN do not fire at each propagation cycle (as it happens with typical multi-layer perceptron networks), but rather fire only when a membrane potential—an intrinsic quality of the neuron related to its membrane electrical charge—reaches a specific value. When a neuron fires, it generates a signal which travels to other neurons which, and in turn, increase or decrease their potentials in accordance with this signal.

In the context of spiking neural networks, the current activation level (modeled as some differential equation) is normally considered to be the neuron's state, with incoming spikes pushing this value higher, and then either firing or decaying over time. Various coding methods exist for interpreting the outgoing spike train as a real-value number, either relying on the frequency of spikes, or the timing between spikes, to encode information.

The term 'multi-level memristor' may denote a memristor having a plurality—i.e., more than two: SET and RESET—of statuses. In a binary memristor, the SET operation may move it from the RESET state to the SET state; whereas the reset operation may move it from the SET state to the RESET state. In a multilevel memristor, the SET operation may move it step-wise towards the SET state.

It may also be noted that a deterministic memristor shows a deterministic behavior if each operation on the memristor state is always the same, known and predictable. In contrast in a stochastic memristor, the SET or RESET operation, or both, is random and thus unpredictable to some extent.

In the following, a detailed description of the figures will be given. All instructions in the figures are schematic. Firstly, a block diagram of an embodiment of the inventive method providing a multi-memristive synaptic element for a cognitive computing system is given. Afterwards, further embodiments, as well as embodiments of the multi-memristive synaptic element for a cognitive computing system, will be described.

FIG. 1 shows a block diagram of an embodiment of the method 100 for providing a multi-memristive synaptic element for a cognitive computing system, the multi-memristive synaptic element comprising an array—in particular a parallel array—of memristive devices. The method comprises providing, 102, an arbitration module for arbitrating a synaptic weight allocation. A related synaptic weight is represented by a synaptic weight variable W of the multi-memristive synaptic element. The method also comprises updating, 104, the synaptic weight variable by a delta amount ΔW. Such an amount may be positive or negative, and assigning, 106, by the arbitration module, the memristive devices to elements of a clock-like ordered circular list for selecting a particular memristor of the memristive devices requiring to be updated by a deterministic, periodic global clock that points to a different memristor at every clock tick. This way the multi-memristive synaptic element has a larger dynamic range and a more linear conductance response than a single memristor synaptic element.

FIG. 2 shows a block diagram of an abstract model of a synaptic element 200, in particular the multi-memristive synaptic element. It is storing a representation of a synaptic weight represented by the synaptic weight variable W 204. The synaptic weight variable W is updated by a positive or negative amount ΔW (weight update 202), such that the updated presentation corresponding to a function W plus ΔW. A recalling of the weight W' (recalled weight 206) corresponds to the stored weight variable W*.

FIG. 3 shows a block diagram of a more detailed embodiment 300 of the synaptic element 200. Here, in arbitration module 304, it ensures that the weight update ΔW 202 is directed to selected ones of the memristors of the array of memristors 302. A read-out unit 306 may use one or more output values of the memristors of the array of memristor 302 in order to build the recalled weight W' 206.

FIG. 4 shows another block diagram of an embodiment of a synaptic element 400. The synaptic element 400 comprises the arbitration module 304, a plurality of memristors 302-1, 302-2, . . . , 302-8, as well as the read-out module 306 which may also be denote as combining module because it combines the output of the memristors. The right-most sub-element is shown with reference numeral 302-8 (being identical to the memristors of the array of FIG. 3), assuming that eight memristors may be present. Any other number is possible. An allowable number of memristors per synaptic element 200 may generally be unlimited, e.g., dozens of memristors.

FIG. 5 shows a block diagram of an embodiment of the circular list 500 in combination with multi-level synaptic elements and, e.g., memristors 302-1, . . . 302-8. A pointer 502 of the circular list 500 points to one of the memristors 302-1, . . . 302-8 at each point in time. The memristor, to which the pointer 502 points to, may be called the selected memristor. As long as the pointer 502 points to a selected memristor, the memristor may be updated. Generally, the circular list may have any number of list elements to work with. It may be noted that the pointer—or a group of pointers—may point to more than one of the memristors at a time. In such a case, the selected group of sub-elements may each perform its weight update process.

FIG. 6 shows a block diagram 600 of an embodiment of a circular list 602 in a first status pointing to the first selected memristor. In the chosen example, each synaptic element 604, 606, 608 may comprise four memristors. The first synaptic element 604 comprises the memristors 610, 612, 614 and 616. As shown, the pointer of the circular list 602 points upwards and addresses memristor 610, shown with bold lines. Line 618 represents the input line from the arbitration module 304. As shown in FIG. 4, the output side of the memristors may be connected to the read-out module 306. As can be seen, in this first status, only one memristor, namely memristor 610, may be selected from any of the synaptic elements 604, 606, 608.

FIG. 7 shows a block diagram 700 of an embodiment of a circular list 602 relating in a second status pointing to the second selected memristor. Here, the pointer of the circular list 602 points to the right side. In this case, memristor 619—shown with bold lines—of the second element 606 may be selected. It may be noted that the advance of the circular list 602 pointer may be related to a global clock.

FIG. 8 shows a block diagram 800 of an embodiment of a circular list 602 relating in a third status pointing to the third selected memristor. In this case, the pointer points downwards, addressing a third memristor, in this case, memristor 620 of synaptic element 608.

FIG. 9 shows a block diagram 900 of an embodiment of a circular list 602 relating in a fourth status pointing to the fourth selected memristor. In this next clock cycle of the circular list 602, the pointer points to the left direction selecting memristor 622 of synaptic element 606.

FIG. 10 shows a block diagram 1000 of an embodiment of a circular list 602 relating in a fifth status, pointing to the fifth selected memristor. In this position, the point of the circular list 602 points to the memristor 610 of synaptic element 604.

FIG. 11 shows a block diagram 1100 of an embodiment of a circular list 602 relating in a sixth status, pointing to the sixth selected memristor. In this exemplary status, the pointer of the circular list 602 points to memristor 624 of synaptic element 608. In contrast to stochastically addressed models of the memristors, this deterministic selection model makes the synaptic device more effective. If wanted a probabilistic component may also be applied.

FIG. 12 shows a graph 1204 related to a synaptic element based on an array 1202 of binary memristors which may only have two possible statuses. The array 1202 of binary memristors may comprise five memristors connected in parallel. A related global clock may consequently have five different positions. It may be noted that the clock ticks are shown as the x-axis of the graph 1204. In total, 25 clock ticks of the global clock are shown. At each tick or step, the global clock advances from one memristor to the next in the array 1202 of the binary memristor. After the fifth memristor has been addressed, the global clock selects again the first memristor.

The input values are shown as "+1" or "−1" representing the positive or negative amount ΔW. From clock tick "1" to clock tick "13", the input value is shown as "+1"; from clock tick 14 onwards, the input value is shown as "−1".

As a consequence, the total weight increases from "0" to "5", wherein "0" represents a non-activated memristor, whereas "5" represents all five activated memristors.

In the lower part of FIG. 12, it is shown which of the individual memristors of the array 1202 of memristor devices is activated. Reference numeral 1210 at clock tick 1 shows that a first memristor of the array 1202 is selected and receives as input a "+1" value. Thus, each reference numeral on the lower left side of the diagram corresponds to the same reference numeral—i.e., the same memristor—on the lower right side of the diagram. On the lower left side of the diagram, it is shown that the individual weights, represented by successively activated memristors, jump from 0 to 1, thereby increasing the total weight value. On the lower right side of the diagram, it is shown that the individual weights, represented by successively deactivated memristors, jump from 1 to 0. Consequently, the total weight of the memristive devices 1202 decreases from a value of "5" to a value of "0". In a similar way a skilled person will understand the reference numerals 1212, 1214, 1216 and 1218 relating to other memristors of the array 1202 of memristors.

FIG. 13 shows graph 1304 related to a synaptic element based on an array 1302 of multi-level memristors which allow multiple possible statuses. In the example shown, the memristors may have three statuses as shown in the lower part of the diagram, namely "0", "1" and "2". Hence, the memristor may increase its activation level from 0 to 1 on a first "+1" input value; and it may increase its activation level again from 1 to 2 on a second "+1" input value. This may easily be seen when comparing the related partial diagrams. Also a decrease is possible.

In comparison to the embodiment shown in FIG. 12, the here shown embodiment allows a smoother transition or higher linearity of the total weight. In the shown example, 10 clock ticks are required to increase the total weight from 0 to 10. Additional "+1" values do not increase the total weight. Thus, the synaptic element may be saturated. During the clock ticks 1 to 5, the memristors relating to reference numeral 1310, 3012, 1314, 1316 and 1318 transition to the "1" status, and during the clock ticks 6 to 10 the same memristors transition to the "2" status. For the same memristors, the transition from the "2" status to the "1" status as well as the transition from the "1" to the "0" status is shown.

The sequence of memristors addressed depends on the clock length and increment step of the global clock. The shown selected memristor sequence is only one example of many possibilities of selecting memristors of synaptic elements.

FIG. 14 shows a block diagram of an exemplary neural network 1400. The exemplary artificial neural network is shown with 5 input lines $in_1$, $in_2$, $in_3$, $in_4$, $in_5$ and 5 output lines $out_1$, $out_2$, $out_3$, $out_4$, $out_5$. The input lines are connected to 5 inbound neuron elements 1402, whereas the five output lines $out_1, \ldots, out_5$ are connected to 5 outbound neuron elements 1406. In between, another set of four intermediate neuron elements 1404 are shown. Different neuron network elements 1402, 1404, and 1406 are connected via lines. Each line may represent a synaptic element, of which only synaptic element 1408 is shown explicitly. Each of the plurality of synaptic elements 1408 may be implemented as one of the elements as shown in FIGS. 2 to 4, or FIGS. 6 to 11.

A skilled person may understand that the higher the number of sub-elements or memristors within each synaptic element 1408 is, the higher is the plasticity and adaptability of the "learned" experience weight of each of the synaptic element 1408.

FIG. 15 shows an embodiment of the multi-memristive synaptic element 1500 for a cognitive computing system. The multi-memristive synaptic element 1502 comprises an array of memristive devices 1502. The multi-memristive synaptic element 1500 comprises also an arbitration module 1504 for arbitrating a synaptic weight allocation. A related synaptic weight being represented by a synaptic weight variable of said multi-memristive synaptic element, and an updating unit 1506 adapted for updating said synaptic weight variable by a delta amount.

The arbitration module 1504 is also adapted for assigning the memristive devices to elements of a clock-like ordered circular list for selecting a particular memristor of the memristive devices requiring to be updated by a deterministic, periodic global clock that points to a different memristor at every clock tick. This way, the multi-memristive synaptic element has a larger dynamic range and a more linear conductance response than a single memristor synaptic element of the array of memristive elements 1502.

Optionally, the multi-memristive element 1500 may comprise a read-out unit 1508. It may collect all data outputs from the array of memristive devices 1502.

Embodiments may be implemented together with virtually any type of von-Neumann architecture computer, regardless of the platform being suitable for storing and/or executing program code. The neural network may, e.g., use the von-Neumann architecture computer as input and/or output device. FIG. 16 shows, as an example, a computing system 1600 suitable being implemented together with multi-memristive synaptic elements and for executing program code related to the proposed method.

The computing system 1600 is only one example of a suitable computer system and is not intended to suggest any limitation as to the scope of use or functionality of embodiments described herein. Regardless, computer system 1600 is capable of being implemented and/or performing any of the functionality set forth hereinabove. In the computer system 1600, there are components, which are operational with numerous other general purpose or special purpose computing system environments or configurations. Examples of well-known computing systems, environments, and/or configurations that may be suitable for use with computer system/server 1600 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 1600 may be described in the general context of computer system-executable instructions, such as program modules, being executed by a computer system 1600. Generally, program modules may include routines, programs, objects, components, logic, data structures, and so on that perform particular tasks or implement particular abstract data types. Computer system/server 1600 may be practiced in distributed cloud computing environments where tasks are performed by remote processing devices that are linked through a communications network. In a distributed cloud computing environment, program modules may be located in both local and remote computer system storage media including memory storage devices.

As shown in the figure, computer system/server 1600 is shown in the form of a general-purpose computing device. The components of computer system/server 1600 may include, but are not limited to, one or more processors or processing units 1602, a system memory 1604, and a bus 1606 that couples various system components including system memory 1604 to the processor 1602. Bus 1606 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 1600 typically includes a variety of computer system readable media. Such media may be any available media that is accessible by computer system/server 1600, and it includes both, volatile and non-volatile media, removable and non-removable media.

The system memory 1604 may include computer system readable media in the form of volatile memory, such as random access memory (RAM) 1608 and/or cache memory 1610. Computer system/server 1600 may further include other removable/non-removable, volatile/non-volatile computer system storage media. By way of example only, storage system 1612 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 1606 by one or more data media interfaces. As will be further depicted and described below, memory 1604 may include at least one program product having a set (e.g., at least one) of program modules that are configured to carry out the functions of the embodiments described herein.

Program/utility 1614, having a set (at least one) of program modules 1616, may be stored in memory 1604 by way of example, and not limitation, as well as an operating system, one or more application programs, other program modules, and program data. Each of the operating system, one or more application programs, other program modules, and program data or some combination thereof, may include an implementation of a networking environment. Program modules 1616 generally carry out the functions and/or methodologies of embodiments as described herein.

The computer system/server 1600 may also communicate with one or more external devices 1618 such as a keyboard, a pointing device, a display 1620, etc.; one or more devices that enable a user to interact with computer system/server 1600; and/or any devices (e.g., network card, modem, etc.) that enable computer system/server 1600 to communicate with one or more other computing devices. Such communication can occur via Input/Output (I/O) interfaces 1614. Still yet, computer system/server 1600 may communicate with one or more networks such as a local area network (LAN), a general wide area network (WAN), and/or a public network (e.g., the Internet) via network adapter 1622. As depicted, network adapter 1622 may communicate with the other components of computer system/server 1600 via bus 1606. It should be understood that although not shown, other hardware and/or software components could be used in conjunction with computer system/server 1600. Examples, include, but are not limited to: microcode, device drivers, redundant processing units, external disk drive arrays, RAID systems, tape drives, and data archival storage systems, etc.

Additionally, the multi-memristive synaptic element for a cognitive computing system 1500 may be attached to the bus system 1606.

The descriptions of the various embodiments of the present disclosure have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present disclosure describes embodiments of a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus', and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus', or another device to cause a series of operational steps to be performed on the computer, other programmable apparatus or other device to produce a computer implemented process, such that the instructions which execute on the computer, other programmable apparatus', or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A computer-implemented method for providing a multi-memristive synaptic element for a cognitive computing system, said multi-memristive synaptic element comprising an array of memristive devices, said method comprising:
    arbitrating, by a programmed hardware processor, a synaptic weight allocation, a related synaptic weight being represented by a synaptic weight variable of said multi-memristive synaptic element,
    updating, using said programmed hardware processor, said synaptic weight variable by a delta amount, and
    assigning, by the programmed hardware processor, said memristive devices to elements of a clock-like ordered circular list for selecting a particular memristor of said memristive devices requiring to be updated by a deterministic, periodic global clock that points to a different memristor at every clock tick,
    such that said multi-memristive synaptic element has a larger dynamic range and a more linear conductance response than a single memristor synaptic element,
    wherein a number of said ordered list of elements in said ordered circular list and an increment rate for said ordered circular list relate to each other in such a way that during consecutive iterations of selections at least one sub-element is different.

2. The method according to claim 1, wherein said memristive devices are organized in a parallel array.

3. The method according to claim 1, wherein said cognitive computing system is an artificial neural network trained with back-propagation.

4. The method according to claim 3, wherein an output $x_j$ of a post-synaptic neuron is given by $x_j=f\ (\Sigma(x_i,\ W_{ij}))$, wherein f is a non-linear function, $x_i$ is an output of a pre-synaptic neuron, and $W_{ij}$ is said synaptic weight variable.

5. The method according to claim 1, wherein said amount is positive or negative.

6. The method according to claim 1, wherein said delta amount $\Delta W_{ij}$ of said synaptic weight variable is given by $\Delta W_{ij}=\lambda*x_i*\delta_j$, wherein $\lambda$ is a learning rate, $x_i$ is an output of a pre-synaptic neuron, and $\delta_j$ is a back-propagated delta error.

7. The method according to claim 1, wherein said cognitive computing system is a spiking neural network.

8. The method according to claim 1, wherein said memristor is selected from the group consisting of a phase change memristor, an electro-ionic memristor and a spintronic memristor.

9. The method according to claim 1, wherein said memristor is a binary memristor or a multilevel memristor.

10. The method according to claim 1, further comprising: providing a second clock in form of a circular list for a further update frequency of said memristive devices.

11. The method according to claim 1, wherein a total number of memristors of said memristive synaptic element is equal for each memristive synaptic element in said cognitive computing system.

12. The method according to claim 1, wherein a total number of list elements in said ordered circular list is co-prime to an increment rate for said ordered circular list.

13. A multi-memristive synaptic element for a cognitive computing system, said multi-memristive synaptic element comprising an array of memristive devices, said multi-memristive synaptic element comprising an arbitration module for arbitrating a synaptic weight allocation, the synaptic weight being represented by a synaptic weight variable of said multi-memristive synaptic element, an updating unit adapted for updating said synaptic weight variable by a delta amount, wherein said arbitration module is also adapted for assigning said memristive devices to elements of a clock-like ordered circular list for selecting a particular memristor of said memristive devices requiring to be updated by a deterministic, periodic global clock that points to a different memristor at every clock tick, such that said multi-memristive synaptic element has a larger dynamic range and a more linear conductance response than a single memristor synaptic element, wherein a number of said ordered list of elements in said ordered circular list and an increment rate for said ordered circular list relate to each other in such a way that during consecutive iterations of selections at least one sub-element is different.

14. The multi-memristive synaptic element according to claim 13, wherein said memristive devices are organized in a parallel array.

15. The multi-memristive synaptic element according to claim 13, wherein said cognitive computing system is an artificial neural network trained with back-propagation.

16. The multi-memristive synaptic element according to claim 15, wherein an output $x_j$ of a post-synaptic neuron is given by $x_j=f\ (\Sigma(x_i,\ W_{ij}))$, wherein f is a non-linear function, $x_i$ is an output of a pre-synaptic neuron, and $W_{ij}$ is said synaptic weight variable.

17. The multi-memristive synaptic element according to claim 13, wherein said delta amount $\Delta W_{ij}$ of said synaptic weight variable is given by $\Delta W_{ij}=\lambda*x_i*\delta_j$, wherein $\lambda$ is a learning rate, $x_i$ is an output of a pre-synaptic neuron, and $\delta_j$ is a back-propagated delta error.

18. A computer program product for operating a multi-memristive synaptic element for a cognitive computing system, said multi-memristive synaptic element comprising an array of memristive devices, said computer program product comprising a non-transitory computer readable storage medium having program instructions embodied therewith, said program instructions being executable by one or more computing systems to cause said one or more computing systems to:

arbitrate a synaptic weight allocation, a related synaptic weight being represented by a synaptic weight variable of said multi-memristive synaptic element, update said synaptic weight variable by a delta amount, and assign said memristive devices to elements of a clock-like ordered circular list for selecting a particular memristor of said memristive devices required to be updated by a deterministic, periodic global clock that points to a different memristor at every clock tick, such that said multi-memristive synaptic element has a larger dynamic range and a more linear conductance response than a single memristor synaptic element, wherein a number of said ordered list of elements in said ordered circular list and an increment rate for said ordered circular list relate to each other in such a way that during consecutive iterations of selections at least one sub-element is different.

* * * * *